(12) United States Patent
Rhee et al.

(10) Patent No.: US 7,539,928 B2
(45) Date of Patent: May 26, 2009

(54) METHOD AND APPARATUS FOR DECODING INNER AND OUTER CODES IN A MOBILE COMMUNICATION SYSTEM

(75) Inventors: Jong-Hun Rhee, Suwon-si (KR); Su-Yean Kim, Incheon (KR); Min-Goo Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 312 days.

(21) Appl. No.: 11/140,077

(22) Filed: May 31, 2005

(65) Prior Publication Data

US 2005/0268205 A1    Dec. 1, 2005

(30) Foreign Application Priority Data

May 31, 2004    (KR) ...................... 10-2004-0039387

(51) Int. Cl.
*H03M 13/00*    (2006.01)
(52) U.S. Cl. ................. 714/784; 714/755; 714/758; 714/766; 714/807; 714/704
(58) Field of Classification Search ............. 714/704, 714/758, 752, 800, 807, 755, 766, 784
See application file for complete search history.

(56) References Cited

U.S. PATENT DOCUMENTS

| | | | | |
|---|---|---|---|---|
| 4,928,288 A | * | 5/1990 | D'Aria et al. ............... 375/287 |
| 5,379,305 A | * | 1/1995 | Weng ......................... 714/774 |
| 5,432,822 A | * | 7/1995 | Kaewell, Jr. ................ 375/340 |
| 5,606,569 A | * | 2/1997 | MacDonald et al. ........ 714/758 |
| 5,694,330 A | * | 12/1997 | Iwamura et al. ............. 714/761 |
| 5,944,848 A | * | 8/1999 | Huang ........................ 714/784 |
| 6,047,395 A | * | 4/2000 | Zook .......................... 714/756 |
| 6,131,178 A | * | 10/2000 | Fujita et al. ................. 714/784 |
| 6,697,985 B1 | * | 2/2004 | Ilani ........................... 714/751 |
| 6,986,092 B2 | * | 1/2006 | Butler et al. ................ 714/752 |
| 7,032,163 B2 | * | 4/2006 | Yano et al. .................. 714/786 |
| 2003/0051201 A1 | * | 3/2003 | Brenna ....................... 714/763 |

FOREIGN PATENT DOCUMENTS

KR    2001/0013217    2/2001

* cited by examiner

*Primary Examiner*—Esaw T Abraham
(74) *Attorney, Agent, or Firm*—Roylance, Abrams, Berdo & Goodman, L.L.C.

(57) ABSTRACT

A method and apparatus for decoding inner and/or outer codes in a mobile communication system. The inner and/or outer codes are decoded at low power and high speed. An inner decoder performs channel decoding and cyclic redundancy checking (CRC) on symbols received through a wireless network. An outer decoder performs outer coding on the received symbols. An erasure symbol identifier outputs information of erasure symbols in which a reception error has occurred. The reception error is determined from a result of the CRC on the received symbols. A controller counts the number of received symbols and the number of erasure symbols, and stops an operation of at least one of the inner and outer decoders when at least one of the number of received symbols and the number of erasure symbols is equal to a preset reference value.

17 Claims, 9 Drawing Sheets

# METHOD AND APPARATUS FOR DECODING INNER AND OUTER CODES IN A MOBILE COMMUNICATION SYSTEM

PRIORITY

This application claims the benefit under 35 U.S.C. § 119 (a) of an application entitled "Method and Apparatus for Decoding Inner and Outer Codes in a Mobile Communication System" filed in the Korean Intellectual Property Office on May 31, 2004 and assigned Serial No. 2004-39387, the entire contents of which are incorporated herein by reference.

BACKGROUND OF THE INVENTION

1. Field of the Invention

The present invention generally relates to a decoding method and apparatus in a mobile communication system. More particularly, the present invention relates to a method and apparatus for decoding inner and outer codes in a mobile communication system that can decode inner and outer codes at low power and high speed in the mobile communication system based on code division multiple access (CDMA) using a Reed-Solomon (RS) code as an outer code, and can simplify a structure of a receiving terminal.

2. Description of the Related Art

With the development of communication technology, mobile communication systems have developed from voice service systems into data service systems. These mobile communication systems can provide broadcasting services as well as various data services. In the Third Generation Partnership Project 2 (3GPP2), various standardization tasks for broadcasting services based on code division multiple access (CDMA) are currently being conducted. According to CDMA2000 1x Revision D of various standards proposed for broadcasting services in 3GPP2, a broadcasting service is called broadcast and multicast service (BCMCS). In addition to CDMA2000 1x Revision D, standards for providing broadcasting services are being created also in relation to the BCMCS of High Rate Packet Data (HRPD) Revision A for a synchronous CDMA system.

Hereinafter, the CDMA-based BCMCS service associated with the CDMA2000 1x Revision D and HRPD Revision A is referred to as the broadcasting service.

The broadcasting service is configured to transmit broadcasting data in a frame unit according to time division multiplexing (TDM). This broadcasting service can use an inner code such as a convolution code or turbo code for channel coding, and an outer code such as a Reed-Solomon (RS) code serving as a well-known error correction code. When the TDM is used to transmit the broadcasting data, a receiving terminal selectively receives only minimum frames, thereby improving reception efficiency. To avoid a transmission error of successively generated broadcasting data, an RS code is used. This RS code is defined in the CDMA2000 1x Revision D specification.

According to the CDMA2000 1x Revision D specification, for example, RS coding is performed using a sub-buffer for the broadcasting service as illustrated in FIG. 1. For example, the RS coding can select one of the coding rates 11/16, 12/16, 13/16, and 14/16, and can be used in RC5/115.2 kbps/20 ms mode. In this case, an inner code structure is defined in the CDMA2000 1x Revision D specification as illustrated in FIG. 2.

Now, a conventional process for encoding and decoding RS codes will be described briefly.

FIG. 1 is a block diagram illustrating an internal structure of a conventional RS encoder. The conventional RS coding process will be described with reference to FIG. 1.

In FIG. 1, channel bits are input to a demultiplexer 110 for a predetermined time according to a predetermined RS coding rate. Then, a demultiplexer (DEMUX) 110 demultiplexes the input channel bits and outputs the demultiplexed channel bits to outer encoders 120. The outer encoders 120 encode the channel bits stored in a plurality of sub-buffers (not illustrated) into RS codes. A multiplexer (MUX) 130 multiplexes RS coded symbols stored in the sub-buffers, and outputs a result of the multiplexing to an inner encoder (not illustrated) such as a channel encoder.

In a front stage of the inner encoder, a frame quality indicator for checking an error is provided. A cyclic redundancy checking (CRC) information bit is inserted into the RS coded symbols. An RS decoder to be described below detects an error of each received frame using the CRC information bit, and erases symbols of an erroneous frame.

The RS code is defined in a well-known Galois field. Assuming that the Galois field is GF ($=2^8$), the number of symbols of one code word is n, and the number of systematic symbols containing broadcasting data among the n symbols is k, the n and k values are defined by $(n,k) \in \{(16,11), (16,12), (16,13), (16,14)\}$. FIG. 2 illustrates an example of a sub-buffer used for RS coding. A symbol and frame structure used for RS coding will be described with reference to FIG. 2.

In FIG. 2, each row is a frame configured by, for example, 2280 bits. Each frame undergoes channel coding through an inner encoder. In FIG. 2, k higher frames are configured by the input channel bits as illustrated in FIG. 1, i.e., systematic symbols, and n−k lower frames are configured by parity symbols generated from the RS coding. An RS code is configured by, for example, an 8-bit symbol. As indicated by a hatched area in a column direction of FIG. 2, n−k parity symbols are generated on the basis of k systematic symbols according to the RS coding.

In this case, 2280 bits configure each frame such that the n−k parity frames are full. The RS coding is performed a total number of 285 (=2280/8) times. When 16 frames are filled in the sub-buffer, each frame is encoded according to inner coding after a CRC information bit is added as illustrated in FIG. 2.

Upon receiving broadcasting data for the BCMCS, a receiving terminal decodes channel bits through an inverse process of outer and inner coding performed by a transmitting terminal. In this case, an error of each frame is detected from a receiving signal undergoing inner decoding such as channel decoding through CRC information. Symbols of an error frame are erased. The RS decoder recovers original signals from decoded frames using erasure information of an error frame.

A conventional decoding process for RS codes is divided into three processes, i.e., a process for searching for an error position of a frame, a process for obtaining an error value, and a process for correcting an error. In the receiving terminal, the RS decoder can correct all frame errors under a condition as shown in Equation (1).

$$s + 2e \leq n - k \qquad \text{Equation (1)}$$

In Equation (1), s denotes the number of erasure symbols to be erased due to an error detected from a result of CRC, e denotes the number of error symbols missing from the CRC result, n denotes the number of symbols configuring one code word indicated by the hatched area in the column direction of FIG. 2, i.e., RS code length, and k denotes the number of systematic symbols containing broadcasting data. In this case, an error symbol is a frame symbol, determined to be 'Good' from the CRC result, in which an error has actually occurred. An erasure symbol corresponds to a case where an error symbol position is identified, but an error bit value is not identified. An error symbol corresponds to a case where an error symbol position and an error bit value are not both identified. In Equation (1), it can be found that erasure symbol correction capability is twice error symbol correction capability.

FIG. 3 is a block diagram illustrating an internal structure of a conventional RS decoder. A process for decoding RS codes will be described with reference to FIG. 3.

First, broadcasting data received by a mobile terminal through a wireless network undergoes a demodulating process and an inner decoding process of convolution decoding or turbo decoding and CRC. Then, input symbols of the broadcasting data are provided to an erasure symbol detector 310 of FIG. 3. The erasure symbol detector 310 detects a position of an erasure symbol from the input symbols on the basis of a CRC result, and outputs position information of an erasure symbol to an erasure polynomial generator 320. The erasure polynomial generator 320 generates a predetermined erasure polynomial for designating a position of an erasure symbol in the input symbols, and outputs the generated erasure polynomial to an error polynomial generator 330.

The error polynomial generator 330 generates a predetermined error polynomial for searching for a position of an error symbol from the input symbols, and provides the generated error polynomial to an error position searcher 340. The error polynomial is generated which includes the erasure polynomial. The error position searcher 340 searches for an error symbol missing from the CRC result using the error polynomial, and provides position information of erasure and error symbols to an error corrector 360. When an error symbol is not present, the error position searcher 340 provides only the position information of erasure symbols to the error corrector 360.

The error polynomial generator 330 provides the error polynomial to an error magnitude searcher 350. The error magnitude searcher 350 obtains error magnitudes of erasure and error symbols using the error polynomial, and outputs information of error magnitudes to the error corrector 360. An error magnitude indicates an error bit stream obtained by estimating a difference between the input symbols and originally transmitted symbols. The error bit stream is obtained using parity symbols added at an RS coding time.

The error corrector 360 outputs systematic symbols from which all errors of the input symbols have been corrected on the basis of the position information of the erasure and error symbols and the error magnitude information, and completes the process for decoding the RS codes.

The conventional RS decoding process includes a process for searching for error symbols missing from the CRC result as well as a process for searching for erasure symbols. Algorithms for searching for positions of the erasure and error symbols are a Berlekamp-Massey algorithm and a modified Euclidean distance algorithm. However, these algorithms have problems in that an internal structure of an RS decoder is complex and both inner and outer decoding operations on error symbols must be performed, resulting in increasing the amount of power consumption of a receiver.

Therefore a need exists for a process for searching for error symbols missing from the CRC result as well as a process for searching for erasure symbols using low power consumption and high speed.

SUMMARY OF THE INVENTION

It is, therefore, an aspect of the present invention to provide a method and apparatus that can decode inner and/or outer codes at low power and high speed in a mobile communication system using a Reed-Solomon (RS) code as an outer code and can simplify a structure of a receiving terminal.

It is another aspect of the present invention to provide a method and apparatus for decoding inner and/or outer codes in a mobile communication system that can simplify a decoding process on error symbols not detected from a cyclic redundancy checking (CRC) result at a Reed-Solomon (RS) decoding time.

The above and other aspects of the present invention can be achieved by a method for decoding inner and/or outer codes in a mobile communication system. The method comprises the steps of counting the number of symbols received through a wireless network; performing cyclic redundancy checking (CRC) on the received symbols; counting the number of erasure symbols in which a reception error has occurred, the reception error being determined from a result of the CRC; and stopping an operation of at least one of an inner decoder and an outer decoder when at least one of the number of received symbols and the number of erasure symbols is equal to a preset reference value.

The above and other aspects of the present invention can also be achieved by an apparatus for decoding inner and/or outer codes in a mobile communication system. The apparatus comprises an inner decoder for performing channel decoding and cyclic redundancy checking (CRC) on symbols received through a wireless network; an outer decoder for performing outer coding on the received symbols; an erasure symbol identifier for outputting information of erasure symbols in which a reception error has occurred, the reception error being determined from a result of the CRC on the received symbols; and a controller for counting the number of received symbols and the number of erasure symbols, and stopping an operation of at least one of the inner decoder and the outer decoder when at least one of the number of received symbols and the number of erasure symbols is equal to a preset reference value.

The above and other aspects of the present invention can also be achieved by an outer decoding apparatus for decoding symbols received through a wireless network. The outer decoding apparatus comprises an erasure symbol detector for outputting position information of erasure symbols in which a reception error has occurred, the reception error being determined from a result of the CRC on the received symbols; an erasure polynomial generator for generating a predetermined erasure polynomial on a basis of the position information of the erasure symbols; an error magnitude searcher for estimating an error bit stream associated with the erasure symbols and outputting error magnitude information; and an error corrector for correcting an error of the received symbols using the position information of the erasure symbols and the error magnitude information, and outputting recovered systematic symbols.

BRIEF DESCRIPTION OF THE DRAWINGS

The above and other aspects and advantages of the present invention will be more clearly understood from the following detailed description taken in conjunction with the accompanying drawings, in which.

Throughout the drawings, the same or similar elements are denoted by the same reference numerals.

DETAILED DESCRIPTION OF EXEMPLARY EMBODIMENTS

Embodiments of the present invention will be described in detail herein below with reference to the accompanying drawings. In the following description, a detailed description of known functions and configurations incorporated herein will be omitted for conciseness.

First, a basic concept of the present invention will be described before a detailed description of the embodiments of the present invention is given.

When symbols encoded into Reed-Solomon (RS) codes are transmitted through a wireless network, an RS decoding process in a receiving terminal is divided into two processes, i.e., a process for searching for an erasure symbol having an error detected from a cyclic redundancy checking (CRC) result and a process for searching for an error symbol, determined to be 'Good' from the CRC result, in which an error has actually occurred. Accordingly, this RS decoding process can improve the error correction capability of an RS decoder.

However, if the performance of RS decoding is not degraded even when an error symbol search process except CRC is excluded, a structure of the RS decoder in the receiving terminal of a mobile communication system can be simplified. In this case, because unnecessary inner and/or outer decoding can be omitted, the power consumption required for decoding is reduced significantly while the error correction capability of the RS decoder is maintained.

The present invention proposes a method and apparatus for decoding inner and outer codes in the mobile communication system using an RS code under the assumption that the performance of RS decoding is not degraded even when an error symbol search process except CRC is excluded. This assumption will be verified in the following. A simplified RS decoding process, and the proposed method and apparatus for decoding inner and outer codes will be described in more detail under this assumption.

Figure 3:
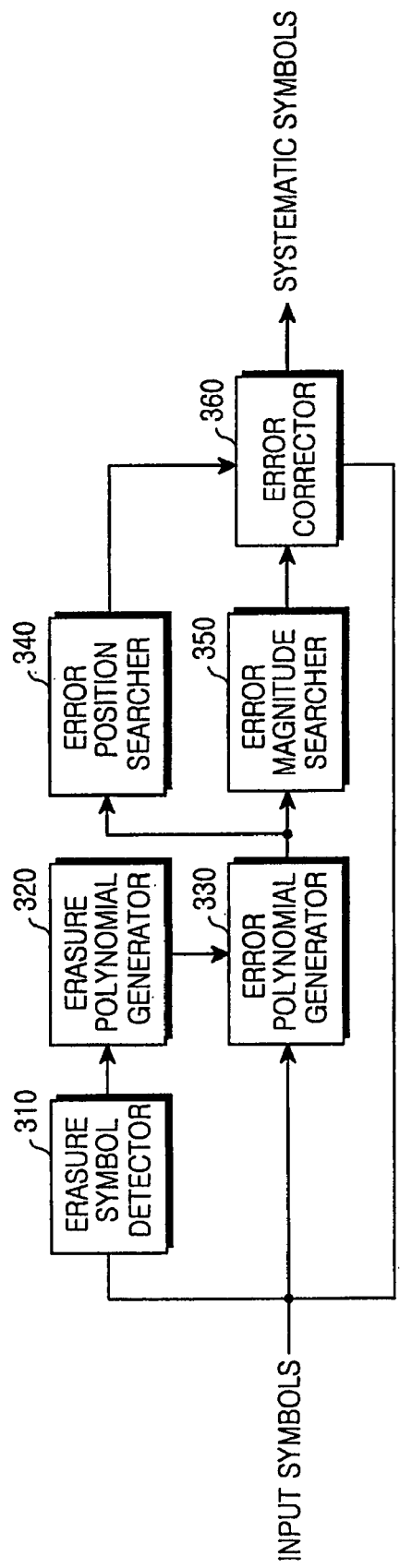
FIG. 3 is a block diagram illustrating an internal structure of a conventional RS decoder.
Figure 4:
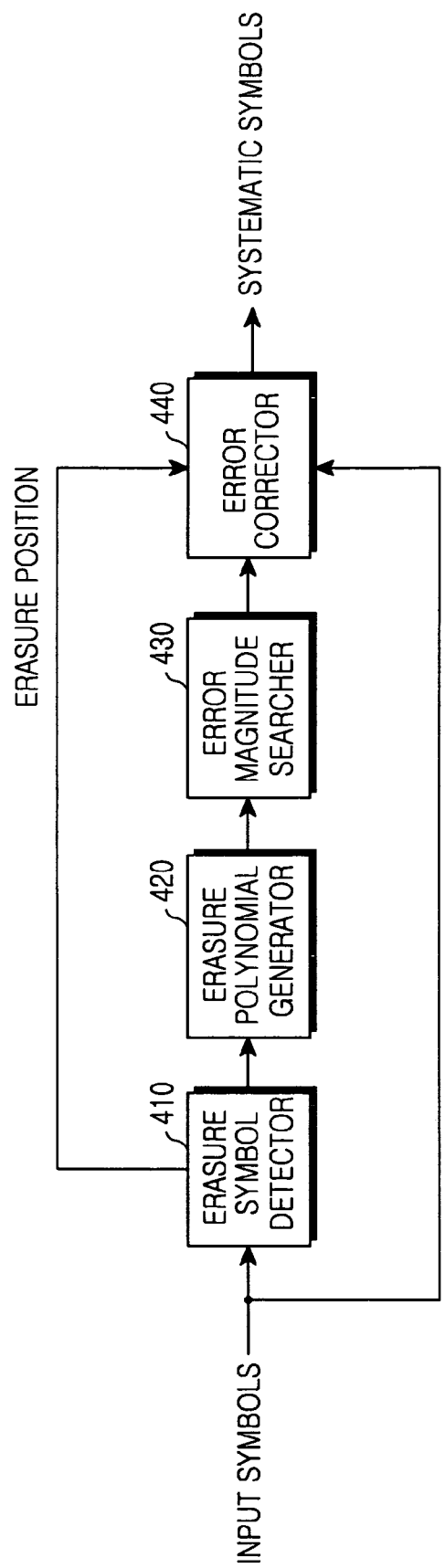
FIG. 4 is a block diagram illustrating an internal structure of an RS decoder in a mobile communication system in accordance with an embodiment of the present invention.

FIG. 4 is a block diagram illustrating an internal structure of an RS decoder in a mobile communication system in accordance with an embodiment of the present invention. The RS decoder of FIG. 4 has a structure obtained by excluding the error polynomial generator 330 of FIG. 3 for generating an error polynomial for searching for a position of an error symbol missing from input symbols determined to be 'Good' from a result of CRC, and the error position searcher 340 of FIG. 3 for searching for an error position using the error polynomial.

In FIG. 4, broadcasting data received by a mobile terminal undergoes a demodulating process and an inner decoding process of convolution decoding or turbo decoding and CRC. Then, input symbols of the broadcasting data are provided to an erasure symbol detector 410. The erasure symbol detector 410 detects a position of an erasure symbol from the input symbols on the basis of a CRC result at an inner decoding time, and outputs position information of an erasure symbol to an error corrector 440 and an erasure polynomial generator 420.

The erasure polynomial generator 420 generates a predetermined erasure polynomial for designating a position of an erasure symbol in the input symbols, and outputs the generated erasure polynomial to an error magnitude searcher 430. The error magnitude searcher 430 obtains an error bit stream obtained by estimating a difference between the input symbols and originally transmitted symbols using the erasure polynomial. The error magnitude searcher 430 outputs the error bit stream serving as error magnitude information to the error corrector 440.

The error corrector 440 corrects an error of the input symbols on the basis of position information of erasure symbols output from the erasure symbol detector 410 and error magnitude information of the erasure symbols output from the error magnitude searcher 430. The error corrector 440 outputs recovered systematic symbols, such that a process for decoding RS codes is completed. That is, the error corrector 440 outputs the systematic symbols from which an error has been corrected in each erasure symbol position detected by the erasure symbol detector 410 by combining the error bit stream (i.e., error magnitude information) and the input symbols.

Figure 5:
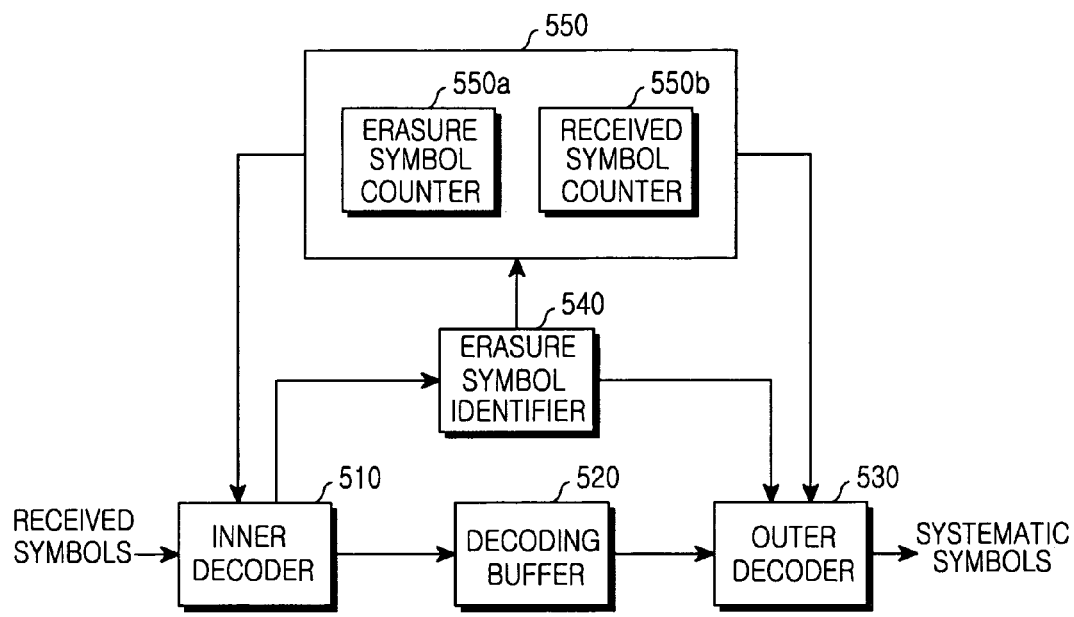
FIG. 5 is a block diagram illustrating an internal structure of an apparatus for decoding inner and outer codes in the mobile communication system using an RS code in accordance with an embodiment of the present invention.

FIG. 5 is a block diagram illustrating an internal structure of an apparatus for decoding inner and outer codes in the mobile communication system using an RS code in accordance with an embodiment of the present invention. In FIG. 5, an inner decoder 510 uses a conventional channel code such as a convolution code or a turbo code, and an outer decoder 530 uses an RS code. The outer decoder 530 of FIG. 5 has the same structure as the RS decoder of FIG. 4.

In FIG. 5, the inner decoder 510 performs channel decoding such as convolution decoding or turbo decoding on symbols received through the wireless network, and performs inner decoding such as CRC for checking an error of the received symbols. The inner decoder 510 outputs the inner decoded symbols to a decoding buffer 520. The decoding buffer 520 buffers the inner decoded symbols output from the inner decoder 510 such that RS decoding on the inner decoded symbols can be performed. In FIG. 5, the outer decoder 530 performs the RS decoding using parity symbols stored in the decoding buffer 520, and outputs decoded systematic symbols.

An erasure symbol identifier 540 of FIG. 5 identifies a result of CRC on the symbols output from the inner decoder 510, and outputs, to the outer decoder 530, information of an erasure symbol determined to be 'Bad' from the CRC result. The outer decoder 530 performs the RS decoding for correcting an error of an erasure symbol among the received symbols using a parity symbol, and outputs the systematic symbols from which an error has been corrected. In accordance with the present invention, a controller 550 controls decoding processes of the inner and outer decoders 510 and 530 to be selectively executed/stopped while taking into account the number of received symbols, the number of valid symbols determined to be 'Good' from the CRC result, and the number of erasure symbols determined to be 'Bad' from the CRC result.

The erasure symbol identifier 540 provides the result of CRC on the received symbols to the controller 550. In the controller 550, a received symbol counter 550a counts the number of received symbols, and an erasure symbol counter 550b counts the number of erasure symbols among the received symbols. The number of valid symbols is computed by subtracting the number of erasure symbols from the number of received symbols through the controller 550.

The apparatus of FIG. 5 performs a decoding process by only referring to the CRC result at an RS decoding time. In the apparatus of FIG. 5, unnecessary inner and/or outer decoding is omitted by excluding the conventional components such as the error polynomial generator 330 and the error position searcher 340 of FIG. 3 for searching for an error symbol determined to be 'Good' from the CRC result. The present invention assumes that a case where the RS decoding is performed using only a CRC result has almost the same performance as a case where the RS decoding is performed while taking into account both a CRC result and an error symbol. This assumption will be verified below.

Now, a principle in which the operations of the inner decoder 510 and the outer decoder 530 are controlled to be selectively executed/stopped will be described.

Figure 1:
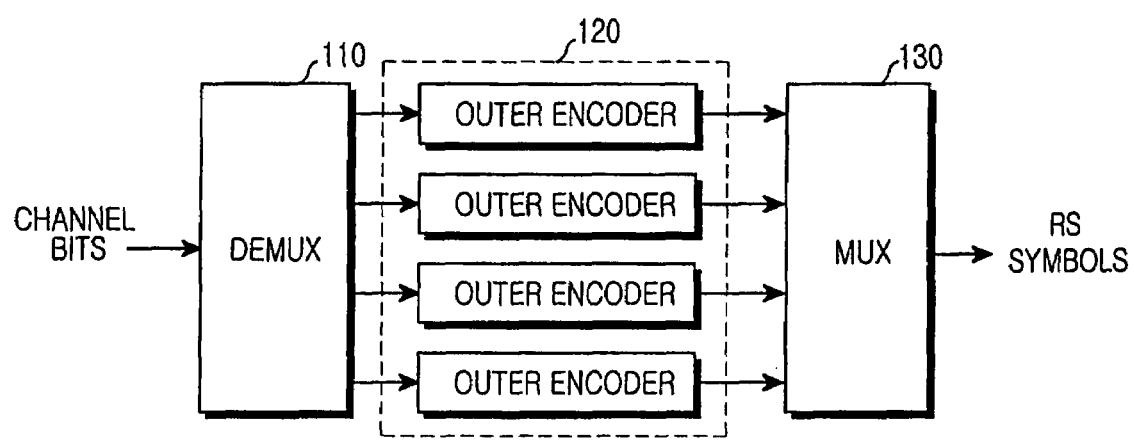
FIG. 1 is a block diagram illustrating an internal structure of a conventional Reed-Solomon (RS) encoder.
Figure 2:
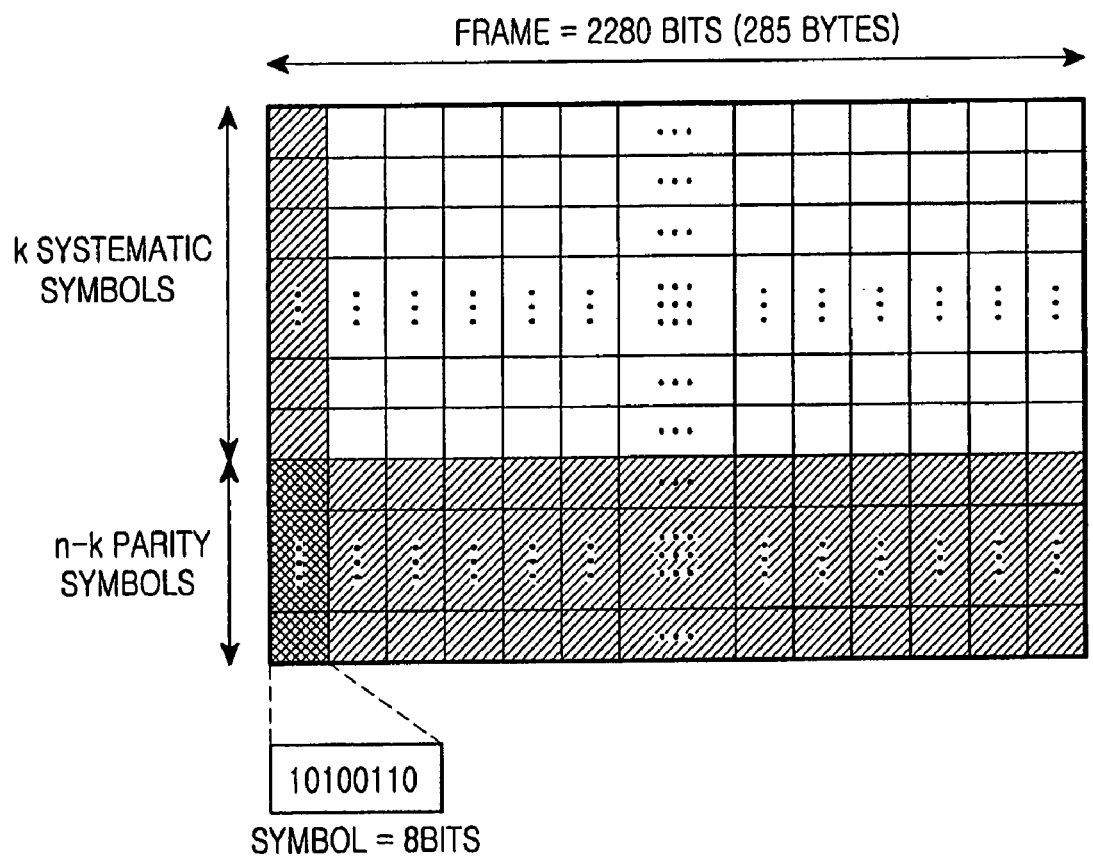
FIG. 2 illustrates a symbol and frame structure used for the conventional RS encoder.

When RS decoding is performed for a code word comprising n symbols as indicated by the hatched area of FIG. 2, it is assumed that the number of systematic symbols is k and the number of parity symbols is n–k. The controller 550 controls the inner and outer decoders 510 and 530. If the number of erasure symbols determined to be 'Bad' from the CRC result exceeds the number of parity symbols, RS decoding is impossible. When the number of erasure symbols is s, an error correction range in the RS decoding is defined as shown in Equation (2).

$$s \leq n-k \qquad \text{Equation (2)}$$

Outer Decoder Control

1. When no erasure symbol is present in the received symbols, the operation of the outer decoder 530, i.e., the RS decoder, is stopped.
2. When the number of received symbols determined to be 'Good' from the CRC result is equal to the number of systematic symbols k, the outer decoder 530 does not receive subsequent symbols and processes the subsequent symbols as erasure symbols until the n symbols are filled.
3. When the number of erasure symbols s is greater than the number of parity symbols n–k, the operation of the outer decoder 530 is stopped.

Inner Decoder Control

When the outer decoder 530 needs to be controlled according to any one of Items 1, 2, and 3, an inner decoding process for the remaining parity symbols of a corresponding code word is stopped.

The inner and outer decoding apparatus of FIG. 5 classifies the received symbols into valid symbols and erasure symbols using only the CRC result, and performs the RS decoding while excluding the presence of an error symbol among the valid symbols. Accordingly, when the k systematic symbols are received among the n symbols as illustrated in FIG. 2, the inner decoding process for symbols (or parity symbols) to be subsequently received is omitted. More specifically, when k valid symbols are sequentially received, the RS decoding for correcting an error does not need to be performed.

When the number of erasure symbols is greater than the maximum number of parity symbols n–k, all systematic symbols cannot be recovered even though the RS decoding is performed. In this case, the RS decoding process and the inner decoding process for subsequent symbols are omitted. Systematic symbols serving as the received valid symbols are output to a host (not illustrated).

When the number of erasure symbols exceeds the error correction range n–k or the number of valid symbols is equal to the number of systematic symbols k, the operation of the inner decoder is stopped, such that the power consumption of the receiver can be reduced. More specifically, if the operations of other components associated with symbol reception such as a Rake receiver connected between a receiver antenna and the inner decoder, and so on can be stopped when the operation of the inner decoder is stopped, the power reduction efficiency can be improved significantly.

A method applied to the apparatus of FIG. 5 will be described with reference to FIGS. 6A and 6B.

Figure 6A:
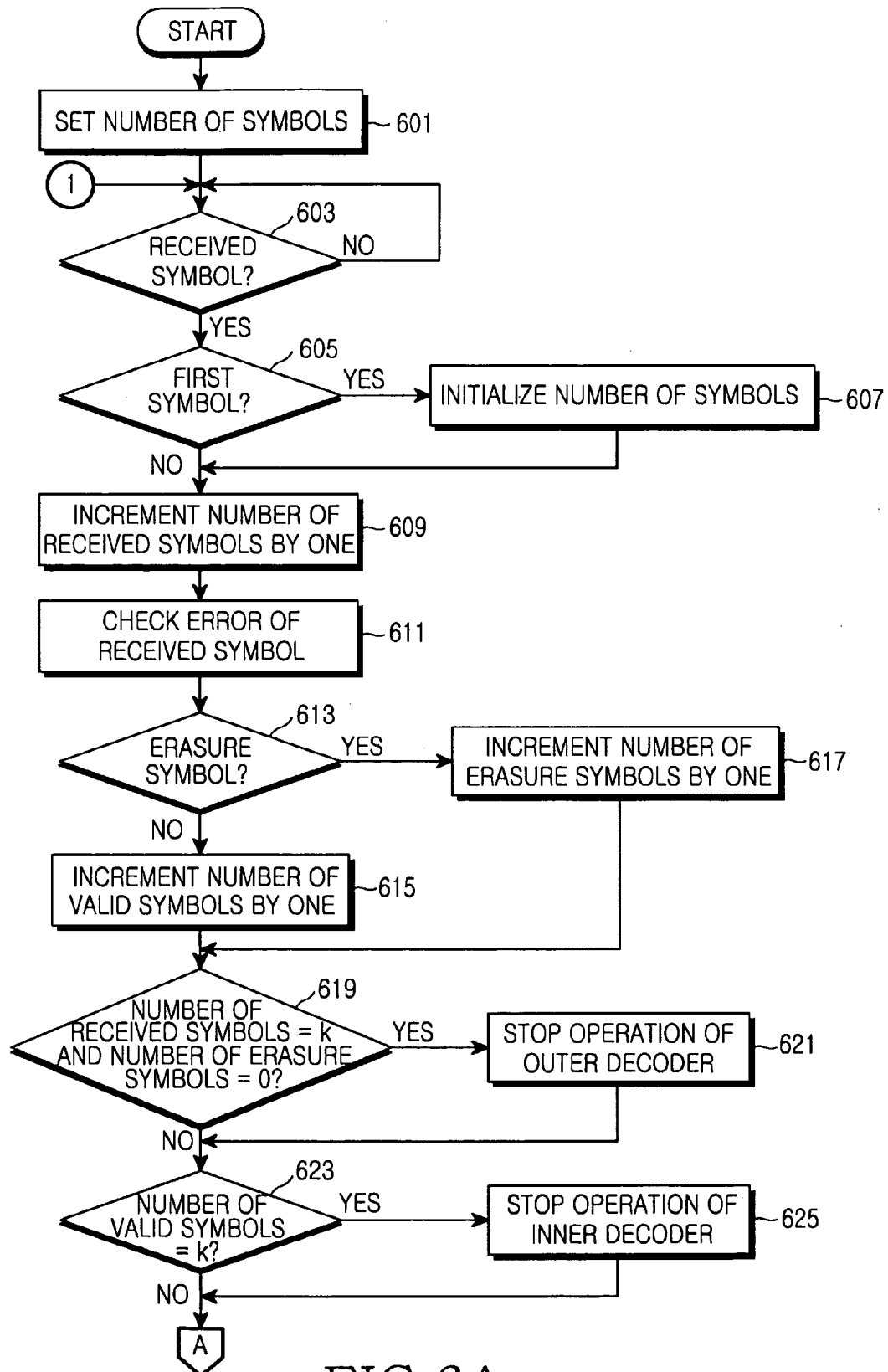
FIGS. 6A and 6B are flow charts illustrating a method for decoding inner and outer codes in the mobile communication system using an RS code in accordance with an embodiment of the present invention.
Figure 6B:
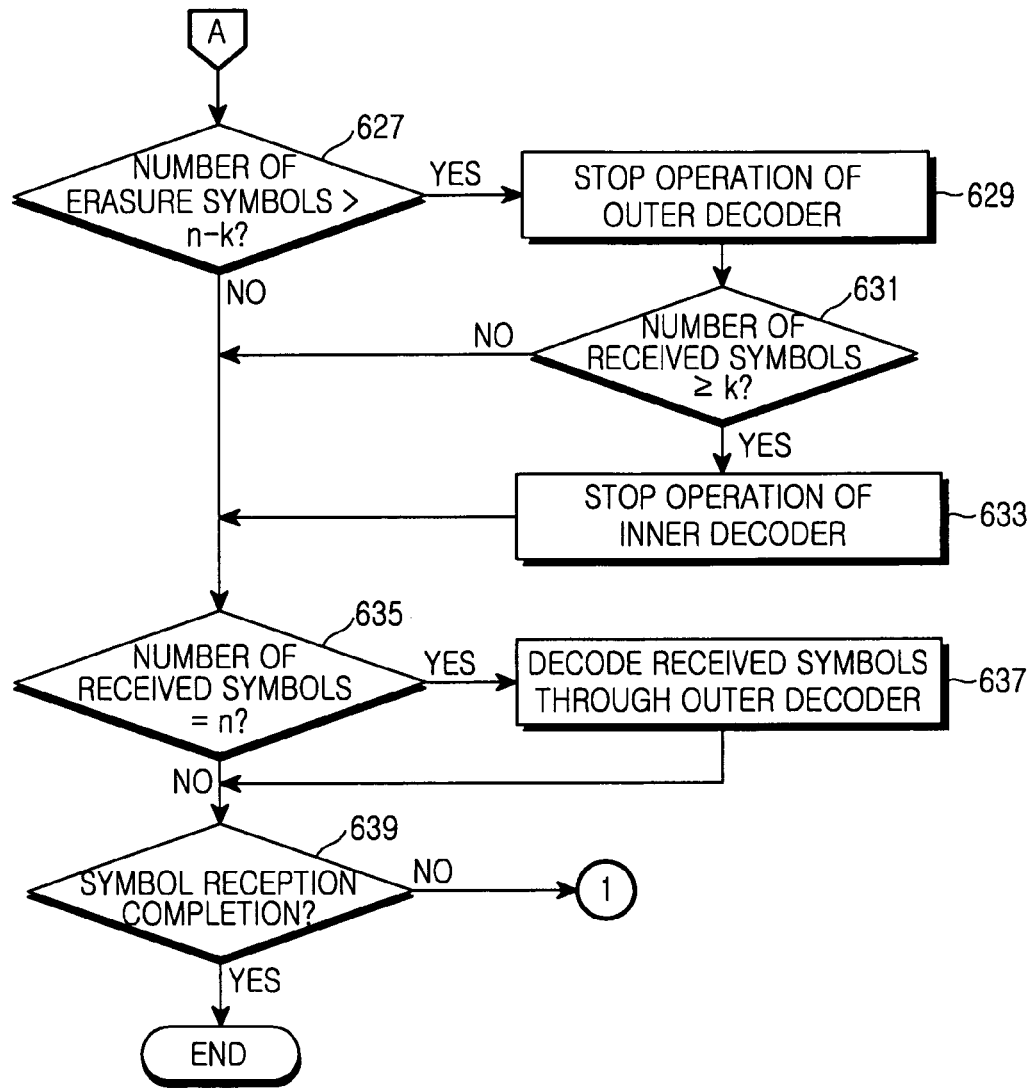

FIGS. 6A and 6B are flow charts illustrating a method for decoding inner and outer codes in the mobile communication system using an RS code in accordance with the present invention.

First, in step 601 of FIG. 6A, the controller 550 of FIG. 5 initially sets the number of valid symbols determined to be 'Good' from the CRC result, the number of erasure symbols determined to be 'Bad' from the CRC result, and the number of received symbols before symbols are transmitted through the wireless network. That is, the receiving terminal may not receive the first symbol when the symbols are received through the wireless network. The receiving terminal can estimate the number of symbols transmitted up to an arbitrary time point when it actually receives a symbol after the first symbol transmission and the number of erasure symbols of the transmitted symbols, by using a difference between a transmission start time (or service start time) and the current time, and a time period required to send one symbol. In this case, the estimated number of symbols is set to be the same as the number of symbols to be received and the number of erasure symbols, and the number of valid symbols is set to be 0. The reason why the number of symbols to be received is set to be the same as the number of erasure symbols is that the symbols transmitted through the wireless network have not been received. The receiving terminal can receive, from a base station, reference time information necessary to estimate the transmission start time.

In step 603, when a symbol is received, the controller 550 detects received symbol input to the inner decoder 510. In step 605, the controller 550 determines if the received symbol is the first symbol of the n symbols as illustrated in FIG. 2. In this case, the controller 550 can identify a sequence number of the currently received symbol using a difference between a transmission start time (or service start time) and the current time, and a time period required to send one symbol. The number of symbols can be estimated using various well-known methods in the mobile communication system.

When it is determined that the currently received symbol is the first received symbol in step 607, the controller 550 initializes the number of erasure symbols and the number of valid symbols to 0 in step 601. In step 609, the received symbol counter 550b of the controller 550 increments the number of received symbols by one. When the number of received symbols is based on one code word, the received symbol counter 550b can count the maximum number of received symbols n according to a sum of the k systematic symbols and the n−k parity symbols. Then, the received symbol counter 550*b* cyclically performs a counting operation using modulo operation, etc.

In step 611, the inner decoder 510 performs CRC on the received symbol, and provides a CRC result to the erasure symbol identifier 540. The erasure symbol identifier 540 provides the result of the CRC on the received symbol to the controller 550. When the controller 550 determines that the received symbol is a valid symbol determined to be 'Good' from the CRC result in step 613, the number of valid symbols is incremented by one in step 615. However, when the controller 550 determines that the received symbol is an erasure symbol determined to be 'Bad' from the CRC result in step 613, the erasure symbol counter 550*a* increments the number of erasure symbols by one in step 617. The number of valid symbols is computed by obtaining a difference between the current number of received symbols and the current number of erasure symbols.

In step 619, the controller 550 identifies the number of received symbols and the number of erasure symbols. A determination is made as to whether the number of received symbols is k and the number of erasure symbols is 0. If the number of received symbols is k and the number of erasure symbols is 0, the controller 550 stops the operation of the outer decoder 530, and controls the outer decoder 530 to output the received symbols as systematic symbols to the host without performing the RS decoding operation on the currently received symbols in step 621. That is, the RS decoding operation using a parity symbol is unnecessary because the first to k-th received symbols are all determined to be valid symbols.

It is preferred that the operation of the inner decoder 510 is stopped when the operation of the outer decoder 530 is stopped in step 621 such that unnecessary power consumption can be prevented. This is not illustrated in FIG. 6A.

In step 623, the controller 550 identifies the number of valid symbols. When it is determined that the number of valid symbols among the received symbols is k, the controller 550 stops the operation of the inner decoder 510 in step 625. When the number of valid symbols among the n received symbols is greater than k (or when the number of received symbols is greater than k and the number of erasure symbols is greater than 1), the RS decoding can be performed. When the number of valid symbols reaches k, the inner decoder 510 does not receive subsequent symbols, i.e., does not perform the inner decoding, but the RS decoding is performed. The power consumption of the inner decoder 510 corresponding to the number of symbols on which the inner decoding is not performed can be avoided. In this case, the controller 550 uses arbitrary symbols processed as erasure symbols in place of the remaining symbols not received.

In step 627, the controller 550 determines if the number of erasure symbols exceeds a value of n−k. When the number of erasure symbols exceeds the value of n−k, the controller 550 stops the operation of the outer decoder 530 in step 629. The controller 550 controls the outer decoder 530 such that valid symbols of the currently received symbols are output to the host in a state in which the RS decoding is not performed when the number of erasure symbols exceeds the number of parity symbols for the RS decoding. This is not illustrated in FIG. 6B.

In step 631, the controller 550 determines if the number of received symbols is greater than or equal to k. If the number of received symbols is greater than or equal to k, the controller 550 stops the operation of the inner decoder 510 in step 633. Step 631 is performed under the condition in which the number of erasure symbols exceeds the value of n−k. For example, when the first to n−k-th received symbols are erasure symbols and the remaining received symbols up to the k-th symbol are valid symbols, subsequent parity symbols do not need to be received. The controller 550 prevents unnecessary power consumption by effectively stopping the operation of the inner decoder 510.

In step 635, when the number of received symbols reaches a value of n, the controller 550 controls the outer decoder 530 to perform the RS decoding on the received symbols. In this case, the number of erasure symbols among the n received symbols must not exceed the value of n−k. When the number of erasure symbols exceeds the value of n−k, step 629 or 633 is performed and then only valid symbols of the received symbols are output to the host. The decoding process of steps 603 to 639 is repeatedly performed until symbol reception is completed.

The apparatus and method for decoding inner and outer codes in the mobile communication system have been described in relation to an example in which data is transmitted in a symbol unit. However, for example, the decoding apparatus and method can also be applied in the case where data is transmitted in a frame unit as in a broadcasting service provided by a code division multiplexing access 2000 first evolution (CDMA2000 1x) system. In this case, a received symbol, an erasure symbol, and a valid symbol in FIGS. 5, 6A, and 6B can be replaced with a received frame, an erasure frame, and a valid frame, respectively. CRC in the inner decoding process is performed in a frame unit.

Next, an example of RS codes of (n,k)=(16,13) defined in Galois field GF ($=2^8$) will be described in accordance with an embodiment of the present invention. In this case, n denotes RS code length, and k denotes the number of systematic symbols.

The error correction capability of RS(16,13) is expressed by s+2e≦3 as shown in Equation (1), where s denotes the number of erasure symbols, and e denotes the number of error symbols missing from a result of CRC. In this case, Equation (3) is given when the conventional RS decoder corrects an error.

$$(s,e) \in \{(0,1),(1,0),(1,1),(2,0),(3,0)\} \qquad \text{Equation (3)}$$

When an error symbol is excluded from Equation (3) and only erasure symbols are taken into account, an error correction range for the received symbols is defined as shown in Equation (4).

$$(s,e) \in \{(1,0),(2,0),(3,0)\} \qquad \text{Equation (4)}$$

Accordingly, it can be found that a performance difference between the conventional RS decoding method and the inventive RS decoding method occurs in a range as shown in Equation (5).

$$(s,e) \in \{(0,1),(1,1)\} \qquad \text{Equation (5)}$$

Probabilities of influencing the decoding performance of the system according to (s,e)=(0,1) and (s,e)=(1,1) as shown in Equation (5) can be computed by Equations (6) and (7), respectively.

$$Pr_{s,e}(0,1) = \frac{1}{13} {}_{16}C_1 (ser)^1 (1-ser)^{15} \frac{{}_{13}C_1}{{}_{16}C_1} P \qquad \text{Equation (6)}$$

$$Pr_{s,e}(1,1) = \frac{1}{13} {}_{16}C_2 (ser)^2$$

$$(1-ser)^{14} \cdot P(1-P)\left(2 \cdot \frac{{}_{13}C_1}{{}_{16}C_1} \cdot \frac{3 C_1}{{}_{15}C_1} + 2 \cdot \frac{{}_{13}C_2}{{}_{16}C_2}\right) \qquad \text{Equation (7)}$$

In Equations (6) and (7), ser is short for a symbol error rate that indicates a probability of an error occurring in one symbol when the inner decoding is performed, and P denotes a probability of wrong CRC. According to the experimentation, an approximate value of P is about $\frac{1}{2}^{16}=1.5\times 10^{-5}$.

Figure 7:
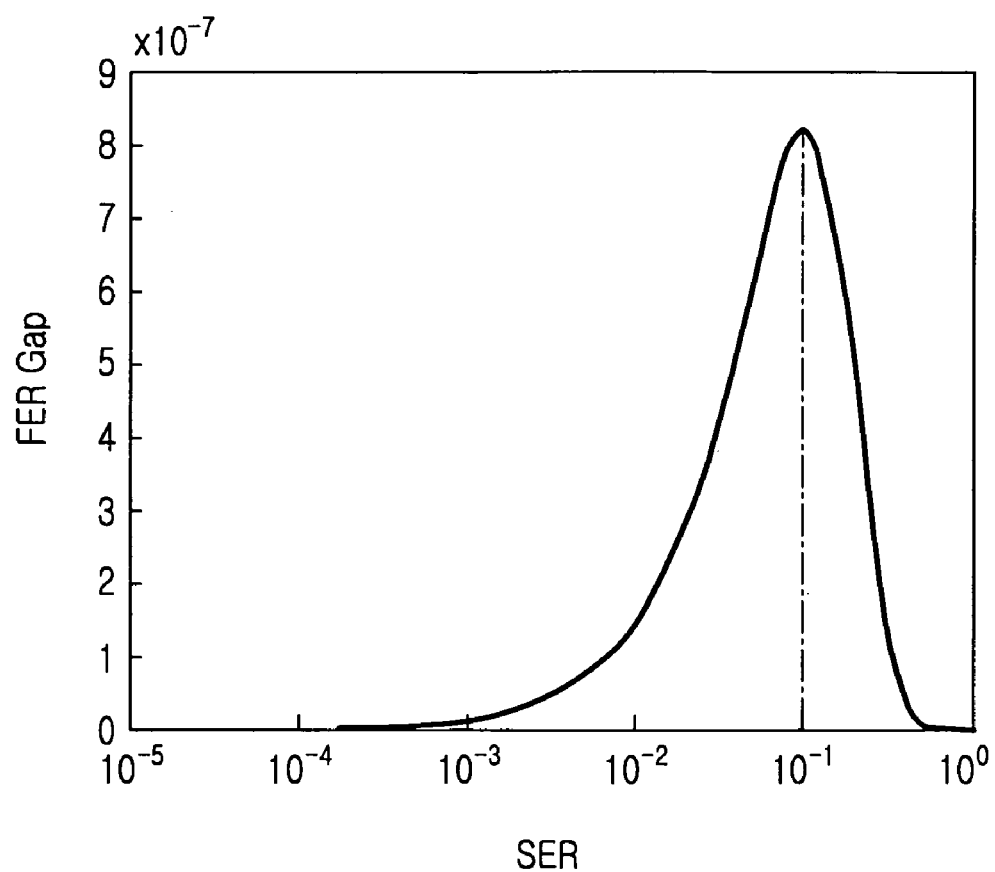
FIG. 7 is a graph illustrating simulation results for a performance comparison between the inventive and conventional methods for decoding an outer code.

FIG. 7 is a graph illustrating simulation results for a performance comparison between the inventive and conventional methods for decoding an outer code. In this simulation, an outer decoding process uses RS decoding. In FIG. 7, the horizontal axis denotes a result of combining Equations (6) and (7) expressed by a ser function, i.e., $Pr_{s,e}(0,1)+Pr_{s,e}(1,1)$, and the vertical axis in case that (s,e) is (0,1) or (s,e) is (1,1), denotes a frame error rate (FER) that indicates a probability of an error occurring in one frame after RS decoding.

In the simulation results of FIG. 7, it can be found that a decoding performance difference is maximal after RS decoding at a point where the ser of an inner decoded signal is $10^{-1}$, but the maximum decoding performance difference is a significantly small value in a $10^{-7}$ FER unit. When a decoding algorithm using only an erasure symbol in accordance with an embodiment of the present invention is applied to a broadcasting service such as broadcast and multicast service (BC-MCS), etc., the inventive method can perform RS decoding by simplifying an inner and outer decoding process as compared with the conventional method, and a performance difference between the inventive and conventional methods is negligible.

Figure 8:
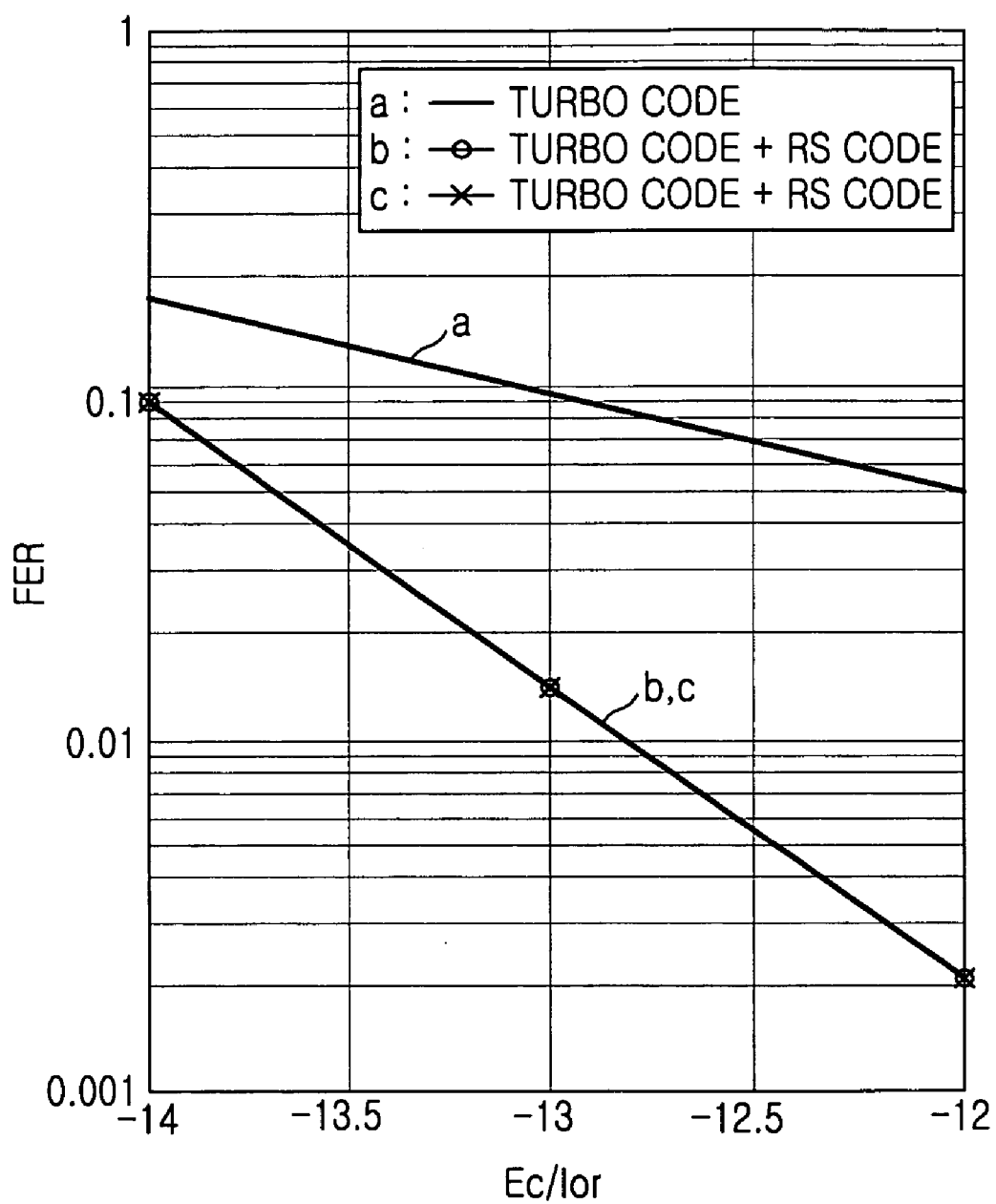
FIG. 8 is a graph illustrating simulation results for a performance comparison between the inventive and conventional methods for decoding inner and outer codes.

FIG. 8 is a graph illustrating simulation results for a performance comparison between the inventive and conventional methods for decoding inner and outer codes. In this simulation, an inner decoding process used a turbo code, and an outer decoding process used an RS code. FIG. 8 illustrates an FER 'a' at a time of decoding using only a turbo code, an FER 'b' at a time of decoding using a turbo code and an RS code according to the conventional method, and an FER 'c' at a time of decoding using a turbo code and an RS code in accordance with the inventive method. In the simulation results, it can be found that the inventive method has almost the same performance as the conventional method although the inner and outer decoding method corrects an error while taking into account only erasure symbols. Accordingly, the inventive method can reduce power consumption by eliminating unnecessary inner and/or outer decoding.

Table 1 shows omitted inner and outer decoding percentages at each Ec/Ior according to the simulation results when it is assumed that inner and outer decoding operation values are 100, respectively. In Table 1, inner decoding is turbo decoding, and outer decoding is RS decoding.

TABLE 1

| Ec/Ior | Omitted Inner Decoding % | Omitted Outer Decoding % |
| --- | --- | --- |
| −14 | 43% | 10% |
| −13 | 36.36% | 11.86% |
| −12 | 54.86% | 14.80% |

In FIG. 8, when FER 1% is a target value, Ec/Ior of about −12.8 dB is required. In Table 1, it can be found that the inventive method can omit 36.4% or more of the conventional outer decoding process and can omit 11.9% or more of the conventional inner decoding process.

As is apparent from the above description, the present invention can perform inner and outer decoding processes at low power and can simplify a structure of a receiving terminal, by simplifying a Reed-Solomon (RS) decoding process in a mobile communication system using an RS code.

Moreover, the present invention provides a method that can decode inner and outer codes at high speed by using a cyclic redundancy checking (CRC) result in the RS decoding process and omitting unnecessary inner and outer decoding.

While the invention has been shown and described with reference to certain embodiments thereof, it will be understood by those skilled in the art that various changes in form and details may be made therein without departing from the spirit and scope of the invention as defined by the appended claims.

What is claimed is:

1. A method for decoding inner and/or outer codes in a mobile communication system, comprising the steps of:
   counting a number of symbols received through a wireless network;
   performing cyclic redundancy checking (CRC) on the received symbols;
   counting a number of erasure symbols in which a reception error has occurred, the reception error being determined from a result of the CRC; and
   stopping an operation of at least one of an inner decoder and an outer decoder by a controller when at least one of the number of received symbols and the number of erasure symbols is equal to a preset reference value.

2. The method of claim 1, wherein the stopping step comprises the step of:
   stopping the operation of the outer decoder when the number of received symbols is equal to a number of systematic symbols of one code word and the number of erasure symbols is 0.

3. The method of claim 1, wherein the stopping step comprises the step of:
   stopping the operation of the outer decoder when the number of erasure symbols exceeds a number of parity symbols of one code word.

4. The method of claim 1, wherein the stopping step comprises the step of:
   stopping all operations of the inner and outer decoders when the number of erasure symbols exceeds the number of parity symbols and the number of received symbols is equal to the number of systematic symbols of one code word.

5. The method of claim 1, further comprising the steps of:
   counting a number of valid symbols determined to be good from the result of the CRC on the received symbols; and
   stopping the operation of the inner decoder when the number of valid symbols is equal to the number of systematic symbols of one code word.

6. The method of claim 1, wherein the outer codes are Reed-Solomon (RS) codes.

7. A method for decoding inner and/or outer codes in a mobile communication system, comprising the steps of:
   counting a number of symbols received through a wireless network;
   performing cyclic redundancy checking (CRC) on the received symbols;
   counting a number of erasure symbols in which a reception error has occurred, the reception error being determined from a result of the CRC; and
   stopping an operation of at least one of an inner decoder and an outer decoder by a controller when at least one of the number of received symbols and the number of erasure symbols is equal to a preset reference value;
   wherein the step of counting the number of received symbols comprises the steps of:

identifying a transmission sequence number of a received symbol using a difference between a transmission start time and a current time and a time period required to send one symbol; and counting the number of received symbols after the transmission sequence number is identified.

8. An apparatus for decoding inner and/or outer codes in a mobile communication system, comprising:

an inner decoder for performing channel decoding and cyclic redundancy checking (CRC) on symbols received through a wireless network;

an outer decoder for performing outer coding on the received symbols;

an erasure symbol identifier for outputting information of erasure symbols in which a reception error has occurred, the reception error being determined from a result of the CRC on the received symbols; and a controller for counting a number of received symbols and a number of erasure symbols, and controlling to stop an operation of at least one of the inner decoder and the outer decoder when at least one of the number of received symbols and the number of erasure symbols is equal to a preset reference value.

9. The apparatus of claim 8, wherein the controller stops the operation of the outer decoder when the number of received symbols is equal to a number of systematic symbols of one code word and the number of erasure symbols is 0.

10. The apparatus of claim 8, wherein the controller stops the operation of the outer decoder when the number of erasure symbols exceeds a number of parity symbols of one code word.

11. The apparatus of claim 8, wherein the controller stops all operations of the inner and outer decoders when the number of erasure symbols exceeds the number of parity symbols and the number of received symbols is equal to the number of systematic symbols of one code word.

12. The apparatus of claim 11, wherein the controller stops operations of other components associated with symbol reception between an antenna stage provided in a receiver with the decoding apparatus and the inner decoder when stopping the operation of the inner decoder.

13. An apparatus for decoding inner and/or outer codes in a mobile communication system, comprising:

an inner decoder for performing channel decoding and cyclic redundancy checking (CRC) on symbols received through a wireless network;

an outer decoder for performing outer coding on the received symbols;

an erasure symbol identifier for outputting information of erasure symbols in which a reception error has occurred, the reception error being determined from a result of the CRC on the received symbols; and a controller for counting a number of received symbols and a number of erasure symbols, and controlling stop an operation of at least one of the inner decoder and the outer decoder when at least one of the number of received symbols and the number of erasure symbols is equal to a preset reference value;

wherein the controller identifies a transmission sequence number of a received symbol using a difference between a transmission start time and a current time and a time period required to send one symbol, and counts the number of received symbols after the transmission sequence number is identified.

14. The apparatus of claim 13, wherein the controller stops the operation of the inner decoder when a number of valid symbols is equal to the number of systematic symbols of one code word while the number of valid symbols determined to be good from the result of the CRC on the received symbols is counted.

15. The apparatus of claim 14, wherein the controller stops operations of other components associated with symbol reception between an antenna stage provided in a receiver with the decoding apparatus and the inner decoder when stopping the operation of the inner decoder.

16. The apparatus of claim 13, wherein the controller processes symbols remaining to be processed as erasure symbols and replaces the remaining symbols with arbitrary symbols when the number of valid symbols is equal to the number of systematic symbols.

17. The apparatus of claim 13, wherein the outer codes are Reed-Solomon (RS) codes.

* * * * *